(12) United States Patent
Kato

(10) Patent No.: US 7,271,792 B2
(45) Date of Patent: Sep. 18, 2007

(54) DISPLAY CONTROL CIRCUIT

(75) Inventor: Fumihiko Kato, Tsuruoka (JP)

(73) Assignee: NEC Electronics Corporation, Kanagawa (JP)

(*) Notice: Subject to any disclaimer, the term of this patent is extended or adjusted under 35 U.S.C. 154(b) by 633 days.

(21) Appl. No.: 10/872,559

(22) Filed: Jun. 22, 2004

(65) Prior Publication Data

US 2004/0263504 A1 Dec. 30, 2004

(30) Foreign Application Priority Data

Jun. 24, 2003 (JP) ............................. 2003-180177

(51) Int. Cl.
*G09G 3/36* (2006.01)
(52) U.S. Cl. ........................................ 345/98; 345/204
(58) Field of Classification Search .................. 345/98, 345/99, 100, 87, 204; 327/94, 112
See application file for complete search history.

(56) References Cited

U.S. PATENT DOCUMENTS

| | | | |
|---|---|---|---|
| 5,006,739 A * | 4/1991 | Kimura et al. ............... | 327/112 |
| 5,440,256 A * | 8/1995 | Erhart et al. .................... | 327/94 |
| 6,100,762 A | 8/2000 | Kato | |
| 6,909,414 B2 | 6/2005 | Tsuchi et al. | |
| 7,027,027 B2 * | 4/2006 | Minamizaki et al. ......... | 345/98 |
| 2001/0026251 A1 | 10/2001 | Hunter et al. | |

FOREIGN PATENT DOCUMENTS

| | | |
|---|---|---|
| CN | 1088288 | 7/2002 |
| CN | 1396580 | 2/2003 |
| JP | 63-292709 | 11/1988 |
| JP | 8-204470 | 8/1996 |
| JP | 11-88076 | 3/1999 |
| JP | 11-150427 | 6/1999 |
| JP | 11-305735 | 11/1999 |
| JP | 2001-4974 | 1/2001 |
| JP | 2001-156559 | 6/2001 |
| JP | 2002-6812 | 1/2002 |
| JP | 2002-169501 | 6/2002 |
| JP | 3338771 | 8/2002 |
| JP | 2003-22056 | 1/2003 |
| JP | 2003-157054 | 5/2003 |

* cited by examiner

*Primary Examiner*—Kevin M Nguyen
(74) *Attorney, Agent, or Firm*—Young & Thompson

(57) ABSTRACT

A display control circuit disclosed includes a selector circuit, an operational amplifier controlling circuit and an operational amplifier. The selector circuit is connected to a digital image data signal line to output an analog signal of the amplitude corresponding to input digital image data. The operational amplifier controlling circuit is connected to the digital image data signal line to output control signals of the polarity according to the input digital image data. The operational amplifier includes a first input stage and a second input stage, made up by complementary connection of differential transistor pairs of opposite conductivity types, and is designed to selectively turn on a first constant current source supplying the bias current to the first input stage or a second constant current source supplying the bias current to the second input stage depending on the polarity of the control signal.

14 Claims, 12 Drawing Sheets

DISPLAY CONTROL CIRCUIT

FIELD OF THE INVENTION

This invention relates to a display control circuit for controlling a panel module which is in need of adjustment of the voltage applied and optical characteristics, such as liquid crystal or organic EL.

BACKGROUND OF THE INVENTION

In general, a flat panel display, typified by a liquid crystal panel or an organic EL (electro-luminescence) panel, is constituted by a capacitive load. In a display control circuit for such application, an input digital video data signal is converted into an analog data signal and subjected to impedance conversion in an operational amplifier provided on the last stage of the control circuit.

As typical of this display control circuit, there is known such a circuit described for example in the Patent Document 1.

The display control circuit, described in the Patent Document 1, two operational amplifiers, namely an operational amplifier for discharge only, provided with a Pch input stage formed by Pch transistors, and an operational amplifier for charging only, provided with an Nch input stage formed by Nch transistors, are connected in parallel with an input.

In a driving method for a certain type of the liquid crystal panel, charging and discharge operations for a load are repeated alternately, that is, charging is first carried out and followed by discharging, followed in turn by charging, and so forth. In such case, no problem is raised even in the display control circuit described in the Patent Document 1.

However, such a driving method for a liquid crystal panel is sometimes used in which charging and discharge operations for a load are not necessarily repeated alternately, that is, charging and discharge operations for a load may be carried out at random, in such a manner that a charging operation, another charging operation, yet another charging operation, a discharge operation and another charging operation may be performed in this order. The display control circuit described in the Patent Document 1 is not up to such case.

There has also been proposed a display control circuit designed to perform a push-pull operation such that full-range input/output and charging/discharge for a load are possible with a sole operational amplifier. This display control circuit may be used unobjectionably for a driving method involving randomized charging/discharge operations such as one described above.

For such case, the operational amplifier comprises the combination of an input stage formed by P-channel transistors and an input stage formed by Nch transistors.

FIG. 10 is a diagram showing an illustrative structure of this type of the conventional display control circuit including a selector circuit 1 and an operational amplifier 2. The selector circuit 1 is connected to a digital image (or video) data signal line 100 to output an analog voltage corresponding to input digital image data. The operational amplifier 2 is connected to the output of the selector circuit 1 and is connected in a voltage-follower configuration, i.e., the operational amplifier 2 has a non-inverting terminal (+1) connected to the output of the selector circuit 10 and has an output terminal connected to an inverting-input terminal(−).

An illustrative structure of the operational amplifier, shown in FIG. 11, includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, a first constant current source I1, connected across the sources of the Nch transistors M1 and M2, connected common, and a low potential side power supply terminal 14, a second constant current source I2, connected across the sources of the Pch transistors M3 and M4 and a high potential side power supply terminal 13, a first load circuit L1 connected across the drains of the Nch transistors M1 and M2 and the high potential side power supply terminal 13, a second load circuit L2 connected across the drains of the Pch transistors M3 and M4 and the low potential side power supply terminal 14, a Pch transistor M11 and an Nch transistor M12, forming an output stage circuit, and a driving stage circuit D1. The Pch transistor M11 and the Nch transistor M12 have sources connected to the high potential side power supply terminal 13 and to the low potential side power supply terminal 14, respectively, while having drains connected common to an output terminal 50. The driving stage circuit D1 level-shifts a signal 15, corresponding to outputs of the load circuits L1 and L2, rendered parallel, to send the resulting level-shifted signal to the gates of the Pch transistor M11 and the Nch transistor M12.

The operational amplifier, shown in FIG. 11, is connected in the voltage follower configuration, as shown in FIG. 10, such that one of the input terminals 12 is connected to the output terminal 50.

Referring to FIG. 11, the operation of this conventional operational amplifier is explained.

In the operational amplifier, shown in FIG. 11, the Nch transistors M1 and M2, and the Pch transistors M3 and M4, forming differential transistor pairs of the opposite conductivity types, are connected together to the input terminals 11 and 12, and respective outputs are taken out parallel as the signal 15, thus forming an input stage allowing for a full range input by complementary operation.

In the driving stage circuit D1, the signal 15 is level-shifted, and supplied to the gates of the Pch transistor M11 and the Nch transistor M12 of the output stage, such that, when a rising (charging) signal is supplied to the input stage, the driving stage circuit D1 receives a signal from the input stage to send such signals to the gates of the Pch transistor M11 and the Nch transistor M12 of the output stage by which the Pch transistor M11 and the Nch transistor M12 electrically charge a load, not shown, from the output terminal 50. The operation is reversed when a decaying (discharging) signal is supplied to the input stage.

In this manner, the Pch transistor M11 and the Nch transistor M12 of the output stage perform the push-pull operation to enable a wide range output to be produced.

That is, with the operational amplifier, shown in FIG. 11, the Pch input stage and the Nch input stage, comprising differential transistor pairs of respective opposite conductivity types, are tied to permit a full range input complementarily and a wide range output.

Other examples of the operational amplifier, in which two differential pair transistors of opposite conductivity types are tied and connected to the input terminals to permit a full-range input by complementary operation, are shown in for example the Patent Documents 2 and 3.

Referring to FIG. 12, the operational amplifier of the Patent Document 2 includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, a first constant current source I1, connected across the sources of the Nch transistors M1 and M2, connected common, and a low potential side power supply terminal 14, and a second constant current source I2, connected across the sources of the Pch transistors M3 and M4, connected common, and a high potential side power supply terminal 13. The operational amplifier of the Patent Document 2 also includes a first current mirror circuit, made up by a Pch transistor M5 having a gate and a drain connected to a drain of the Nch transistor M1 and having a source connected to a high potential side power supply terminal 13, and a Pch transistor M6, having a gate connected to the gate of the Pch transistor M5, a drain connected to the drain of the Pch transistor M3 and a source connected to the high potential side power supply terminal 13, and a second current mirror circuit, made up by a Pch transistor M7, having a gate and a drain connected to a drain of the Nch transistor M2 and having a source connected to the high potential side power supply terminal 13, and a Pch transistor M8, having a gate connected to the gate of the Pch transistor M7, a drain connected to the drain of the Pch transistor M4 and a source connected to the high potential side power supply terminal 13. The operational amplifier of the Patent Document 2 also includes a load circuit, made up by Nch transistors M9 and M10, connected across the drains of the Pch transistors M3 and M4 and the low potential side power supply terminal 14, a Pch transistor M11 and an Nch transistor M12, forming an output stage circuit, each having a source connected to the high potential side power supply terminal 13 and to the low potential side power supply terminal 14 and having a drain connected common to an output terminal 50, and a driving circuit D1 for level-shifting a signal 16 from the drain of the Nch transistor M10 of the load circuit and for coupling the level-shifted signal to each of the gates of the Pch transistor M11 and the Nch transistor M12 of the output stage circuit.

The operational amplifier, shown in FIG. 12, is connected in the voltage-follower configuration, as shown in FIG. 10, so that the inverting input terminal 12 is connected to the output terminal 50.

Referring to FIG. 12, the operation of the conventional operational amplifier will be described.

Similarly to the operational amplifier, shown in FIG. 11, the operational amplifier, shown in FIG. 12, in which an Nch input stage and a Pch input stage of respective opposite conductivity types are tied together, permits a full-range input by complementary operation, while the output stage is designed to perform push-pull operations to yield a wide range output.

Moreover, the Nch transistor M1, forming a differential pair, has a drain connected in a current mirror configuration to a drain of the Pch transistor M3, forming the other differential pair, via a current mirror circuit, made up by Pch transistors M5 and M6, whilst the Nch transistor M2, forming the differential pair, has a drain connected in a current mirror configuration to a drain of the Pch transistor M4, forming the other differential pair, via another current mirror circuit, made up by Pch transistors M7 and M8. Thus, by momentarily increasing the bias current of the input stage only when a slew rate is needed, the charging or discharge speed may be increased without increasing the steady-state current.

[Patent Document 1]
Japanese Patent Kokai Publication No. JP-P2002-169501A

[Patent Document 2]
Japanese Patent Kokai Publication No. JP-A-08-204470

[Patent Document 3]
JP Patent No. 3338771

SUMMARY OF THE DISCLOSURE

In using an input stage in an operational amplifier, in which an Nch input stage and a Pch input stage of respective opposite conductivity types are tied together to permit a full range input by complementary operation, there is raised a problem that the value of current flowing in the load circuit of the input stage as well as the d.c. gain in the input stage are changed appreciably according to the input voltage of the operational amplifier.

If, in the operational amplifier, shown in FIG. 12, the current flowing through the constant current sources I1 and I2 are assumed to be i1 and i2, respectively, the current flowing in the load transistors M9 and M10 in the input range, in which the Nch input stage composed of the Nch transistors M1 and M2 is turned off and the Pch input stage composed of the Pch transistors M3 and M4 is turned on, is i2.

The value of the current flowing in the load transistors M9 and M10 in the input range, in which both the Nch input stage and the Pch input stage are on, is i1+i2.

The value of the current flowing in the load transistors M9 and M10 in the input range, in which the Nch input stage is turned on and the Pch input stage is turned off, is i1.

Thus, the value of the current flowing in the Nch transistors M9 and M10 of the load circuit is changed in dependence upon the on/off state of the respective input stages.

If the value of the current flowing in the transistors M9 and M10 of the load circuit is changed, the value of the offset voltage produced in each of the input stage and in the driving stage is changed.

If now the driving stage D1 is optimized so that input stage current i1=i2, and so that the offset voltage becomes smallest, in keeping with the current value i1 (=i2), the offset voltage becomes smallest under a condition of the current value i1 being equal to i2. However, under a condition that both of the input stages are turned on, that is, that the value of the current flowing in the load transistors M9 and M10 is i1+i2, the offset voltage becomes larger.

On the other hand, if the driving stage D1 is optimized so that the offset voltage becomes smallest for the current value i1+i2, the offset voltage becomes smallest under a condition of the current value i1+i2. However, under a condition that one of the input stages is off, that is, that the value of the current flowing in the load transistors M9 and M10 is i1 or i2, the offset voltage becomes larger.

Additionally, the d.c. gain of the input stage is changed with changes in the on/off state of each input stage.

If the transfer conductance of each of the transistors M1 to M10 is expressed as gm1 to gm10 and the output impedance thereof is expressed as r1 to r10, the d.c. gain of the input stage in the input range, in which the Nch input stage and the Pch input stage are turned off and on, respectively, may be expressed by the following formula (1):

$$gm3 \cdot (r4 // r10) \qquad (1).$$

The d.c. gain of the input stage in the input range, in which both the Nch input stage and the Pch input stage are turned on, may be expressed by the following formula (2):

$$(gm2+gm3)\cdot(r4//r8//r10) \qquad (2).$$

The d.c. gain of the input stage in the input range, in which the Nch input stage and the Pch input stage are turned on and off, respectively, may be expressed by the following formula (3):

$$gm2\cdot(r8//r10) \qquad (3)$$

As may be seen from the above formulas (1) to (3), the d.c. gain of the operational amplifier, stated in the Patent Document 2, is changed, in dependence upon the on/off state of the respective input stages.

In general, an operational amplifier suffers from the problem that, if the d.c. gain is increased, the stability of the operational amplifier in high frequency region is deteriorated and susceptible to oscillations.

Thus, in optimizing the operational amplifier, the current flowing in the driving stage of the operational amplifier needs to be increased for assuring the operating stability in the range of the above formula (2) in which the operational amplifier is deteriorated most significantly in stability.

It is also effective to decrease the steady-state current flowing through the input stage to stabilize the operational amplifier. However, in such case, the slew rate of the operational amplifier is deteriorated, thus diminishing the charging/discharge capability.

Thus, the larger the d.c. gain, the more current has to be caused to flow in the operational amplifier. This proves a hindrance in reducing the overall power dissipation of the operational amplifier.

That is, in the conventional display control circuit and in the conventional operational amplifier, the problem that the offset voltage cannot be reduced to a minimum for the full input range, and the problem that the d.c. gain of the input stage is changed with the input range, prove a bottleneck in reducing the overall power dissipation of the operational amplifier.

In view of the above-depicted status of the art, it is an object of the present invention to provide a display control circuit employing an operational amplifier, in which the offset voltage may be reduced to a minimum for the full input range, and in which the d.c. gain of the input stage is not changed with the input range, even in case the power dissipation of the operational amplifier is lowered.

The above and other objects are attained by a display control circuit in accordance with a first aspect of the present invention, comprising:

selector means connected to a digital image data signal line to output an analog signal of a magnitude corresponding to the input digital image data, operational amplifier controlling means connected to a digital image data signal line to output control signals of the polarities in keeping with the input digital image data, and an operational amplifier including a first input stage and a second input stage, made up by complementary connection of differential transistor pairs of opposite conductivity types. The operational amplifier is so arranged that a first constant current source supplying the bias current to the first input stage or a second constant current source supplying the bias current to the second input stage is selectively turned on depending on the polarity of the control signal.

In the display control circuit in accordance with a second aspect of the present invention, the operational amplifier as defined in the first aspect of the present invention, preferably includes a first differential transistor pair and a second differential transistor pair of respective opposite conductivity types, having control electrodes connected to a first input terminal and to a second input terminal, respectively, and having second electrodes connected common, a first constant current source having one end connected to a second power supply terminal and a second constant current source having one end connected to a first power supply terminal, respectively, a first transistor and a second transistor of respective opposite conductivity types, the first transistor having a first electrode connected to second electrodes, connected common, of the first differential transistor pair, the second transistor having a first electrode connected to the second electrodes, connected common, of the second differential transistor pair, the first and second transistors having second electrodes connected to the other ends of the first and second constant current sources, respectively, and having control electrodes supplied with the control signal, and a first load circuit connected across the first electrodes of the first and second differential transistor pairs and the first power supply terminal and a second load circuit connected across the first electrodes of the first and second differential transistor pairs and the second power supply terminal.

In the display control circuit according to a third aspect of the present invention, the operational amplifier as defined in the first aspect of the present invention, preferably includes a first differential transistor pair and a second differential transistor pair of respective opposite conductivity types, having control electrodes connected to a first input terminal and to a second input terminal, respectively, and having second electrodes connected common, a first constant current source having one end connected to a second power supply terminal and a second constant current source having one end connected to a first power supply terminal, respectively, a first transistor and a second transistor of respective opposite conductivity types, the first transistor having a first electrode connected to the second electrodes, connected common, of the first differential transistor pair, the second transistor having a first electrode connected to the second electrodes, connected common, of the second differential transistor pair, the first and second transistors having second electrodes connected to the other ends of the first and second constant current sources and having control electrodes supplied with the control signal, a first load circuit connected across the first electrodes of the first and second differential transistor pairs and the first power supply terminal and a second load circuit connected across the first electrodes of the first and second differential transistor pairs and the second power supply terminal, a third transistor and a fourth transistor of opposite conductivity types, the third transistor being connected across the second electrodes of the first differential transistor pair, connected common, and the second power supply terminal, and the fourth transistor being connected across the second electrodes of the second differential transistor pair, connected common, and the first power supply terminal, a fifth transistor and a sixth transistor of opposite conductivity types, having first electrodes connected common to an output terminal and having second electrodes connected to the first and second power supply terminals, respectively, the fifth and sixth transistors performing push-pull operations by inputs to respective control terminals, and a driving circuit for level-shifting a signal supplied parallel from the first and second load circuits to supply the level-shifted input signals to the control electrodes of the fifth and sixth transistors.

In the display control circuit according to a fourth aspect of the present invention, the operational amplifier as defined in the first aspect of the present invention, preferably includes a first differential transistor pair and a second differential transistor pair of respective opposite conductivity types, having control electrodes connected to a first input terminal and to a second input terminal, respectively, and having second electrodes connected common, a first constant current source having one end connected to a second power supply terminal and a second constant current source having one end connected to a first power supply terminal, a first transistor and a second transistor of respective opposite conductivity types, the first transistor having a first electrode connected to the second electrodes, connected common, of the first differential transistor pair, the second transistor having a first electrode connected to the second electrodes, connected common, of the second differential transistor pair, the first and second transistors having second electrodes connected to the other ends of the first and second constant current sources and having control electrodes supplied with the control signal, a first current mirror circuit connected across an output end of the first differential transistor pair and an output end of the second differential transistor pair on one hand and the first power supply terminal on the other hand, a second current mirror circuit connected across the other output end of the first differential transistor pair and the other output end of the second differential transistor pair on one hand and the first power supply terminal on the other hand, and a seventh transistor and an eighth transistor, having one first electrode connected to one output end of the second differential transistor pair and to the first current mirror circuit and having the other first electrode connected to the other output end of the second differential transistor pair and to the second current mirror circuit, the seventh and eighth transistors having respective second electrodes connected to the second power supply terminal, the seventh and eighth transistors having control electrodes connected in common with the one first electrode.

In the display control circuit according to a fifth aspect of the present invention, the operational amplifier as defined in the first aspect of the present invention, preferably includes a first differential transistor pair and a second differential transistor pair of respective opposite conductivity types, having control electrodes connected to a first input terminal and to a second input terminal, respectively., and having second electrodes connected common, a first constant current source having one end connected to a second power supply terminal and a second constant current source having one end connected to a first power supply terminal, a first transistor and a second transistor of respective opposite conductivity types, the first transistor having a first electrode connected to the second electrodes, connected common, of the first differential transistor pair, the second transistor having a first electrode connected to the second electrodes, connected common, of the second differential transistor pair-, the first and second transistors having second electrodes connected to the other ends of the first and second constant current sources and having control electrodes supplied with the control signal, a first current mirror circuit connected across an output end of the first differential transistor pair and an output end of the second differential transistor pair on one hand and the first power supply terminal on the other hand, a second current mirror circuit connected across the other output end of the first differential transistor pair and the other output end of the second differential transistor pair on one hand and the first power supply terminal on the other hand, a third transistor and a fourth transistor of opposite conductivity types, the third transistor being connected across the second electrodes of the first differential transistor pair, connected common, and the second power supply terminal, and the fourth transistor being connected across the second electrodes of the second differential transistor pair, connected common, and the first power supply terminal, a fifth transistor and a sixth transistor of opposite conductivity types, having first electrodes connected common to an output terminal and having second electrodes to the first and second power supply terminals, respectively, the fifth and sixth transistors performing push-pull operations by inputs to respective control terminals, a seventh transistor and an eighth transistor, having one first electrode connected to one output end of the second differential transistor pair and to the first current mirror circuit and having the other first electrode connected to the other output end of the second differential transistor pair and to the second current mirror circuit, the seventh and eighth transistors having respective second electrodes connected to the second power supply terminal, the seventh and eighth transistors having connected control electrodes connected in common with the one first electrodes, and a driving circuit for level-shifting a signal supplied parallel from the first and second load circuits to supply the level-shifted input signals to the control electrodes of the fifth and sixth transistors.

A display control circuit in accordance with a sixth aspect of the present invention, comprises: selector means connected to a digital image data signal line to output an analog signal of a magnitude corresponding to the input digital image data, operational amplifier controlling means connected to a digital image data signal line to output control signals of the polarities in keeping with the input digital image data, and an operational amplifier including a first input stage and a second input stage, each made up by complementary connection of differential transistor pairs of opposite conductivity types, the operational amplifier being arranged so that a first constant current source supplying the bias current to the first input stage, and a second constant current source supplying the bias current to the second input stage, are selectively turned on depending on the polarity of the control signal; wherein an output of said selector circuit is changed over responsive to a switching signal in respective reverse phases and coupled to said first and second input stages respectively, and an output terminal is changed over responsive to said switching signal in respective reverse phases and coupled to said second and first input stages respectively, so that said first and second input stages are controlled to be interchanged by said switching signal.

In the display control circuit according to a seventh aspect of the present invention, the operational amplifier as defined in the sixth aspect of the present invention, preferably includes a first differential transistor pair and a second differential transistor pair of respective opposite conductivity types, having control electrodes connected to a first input terminal and to a second input terminal, respectively, and having second electrodes connected common, a first constant current source having one end connected to a second power supply terminal and a second constant current source having one end connected to a first power supply terminal, a first transistor and a second transistor of respective opposite conductivity types, the first transistor having a first electrode connected to the second electrodes, connected common, of the first differential transistor pair, the second transistor having a first electrode connected to the second electrodes, connected common, of the second differential transistor pair, the first and second transistors having second electrodes connected to the other ends of the first and second constant current sources, respectively, and having control electrodes supplied with the control signal, a first current mirror circuit connected across an output end of the first differential transistor pair and an output end of the second differential transistor pair on one hand and the first power supply terminal on the other hand, a second current mirror circuit connected across the other output end of the first differential transistor pair and the other output end of the second differential transistor pair on one hand and the first power supply terminal on the other hand, a seventh transistor and an eighth transistor, having one first electrode connected to one output end of the second differential transistor pair and to the first current mirror circuit and having the other first electrode connected to the other output end of the second differential transistor pair and to the second current mirror circuit, the seventh and eighth transistors having respective second electrodes connected to the second power supply terminal, the seventh and eighth transistors having control electrodes connected common, first and second switches for changing over one output end or the other output end of the second differential transistor pair for operating in reverse phase, responsive to a switching signal, for coupling the output end changed over for operating in reverse phase to control electrodes of the seventh and eighth transistors connected common, and third and fourth switches for changing over the other output end or the one output end of the second differential transistor pair for operating in reverse phase, responsive to the switching signal, for coupling the output end changed over for operating in reverse phase to an output.

In the display control circuit according to an eighth aspect of the present invention, the operational amplifier includes the operational amplifier as defined in the sixth aspect of the present invention, preferably a first differential transistor pair and a second differential transistor pair of respective opposite conductivity types, having control electrodes connected to a first input terminal and to a second input terminal, respectively, and having second electrodes connected common, a first constant current source having one end connected to a second power supply terminal and a second constant current source having one end connected to a first power supply terminal, a first transistor and a second transistor of respective opposite conductivity types, the first transistor having a first electrode connected to the second electrodes, connected common, of the first differential transistor pair, the second transistor having a first electrode connected to the second electrodes, connected common, of the second differential transistor pair, the first and second transistors having second electrodes connected to the other ends of the first and second constant current sources, respectively, and having control electrodes supplied with the control signal, a first current mirror circuit connected across an output end of the first differential transistor pair and an output end of the second differential transistor pair on one hand and the first power supply terminal on the other hand, a second current mirror circuit connected across the other output end of the first differential transistor pair and the other output end of the second differential transistor pair on one hand and the first power supply terminal on the other hand, a third transistor and a fourth transistor of opposite conductivity types, the third transistor being connected across the second electrodes of the first differential transistor pair, connected common, and the second power supply terminal, and the fourth transistor being connected across the second electrodes of the second differential transistor pair, connected common, and the first power supply terminal, a fifth transistor and a sixth transistor of opposite conductivity types, having first electrodes connected common to an output terminal and having second electrodes connected to the first and second power supply terminals, respectively, the fifth and sixth transistors performing push-pull operations by inputs to respective control terminals, a seventh transistor and an eighth transistor, having one first electrodes connected to one output end of the second differential transistor pair and to the first current mirror circuit and having the other first electrodes connected to the other output end of the second differential transistor pair and to the second current mirror circuit, the seventh and eighth transistors having respective second electrodes connected to the second power supply terminal, the seventh and eighth transistors having control electrodes connected common, a driving circuit for level-shifting a signal supplied parallel from the first and second load circuits to supply the level-shifted input signals to the control electrodes of the fifth and sixth transistors, first and second switches for changing over one output end or the other output end of the second differential transistor pair for operating in reverse phase, responsive to a switching signal, for coupling the output end changed over for operating in reverse phase to control electrodes of the seventh and eighth transistors connected common, and third and fourth switches for changing over the other output end or the one output end of the second differential transistor pair for operating in reverse phase, responsive to the switching signal, for coupling the output end changed over for operating in reverse phase to an output.

In the display control circuit according to a ninth aspect of the present invention, the digital image data as defined in any one among the first to eighth aspects of the present invention, is preferably composed of grayscale data having plural bit widths.

In the display control circuit according to a tenth aspect of the present invention, the digital image data as defined in any one among the first to eighth aspects of the present invention, the digital image data is preferably composed of grayscale data having plural bit widths and polarity data defining the output polarity.

In the display control circuit according to an eleventh aspect of the present invention, the operational amplifier controlling means as defined in any one among the first to eighth aspects of the present invention, generates a signal shutting off the constant current source of the Pch side input stage and activating the constant current source of the Nch side input stage in case an analog signal corresponding to the digital image data is higher than an intermediate voltage and wherein the operational amplifier controlling means generates a signal activating the constant current source of the Pch side input stage and shutting off the constant current source of the Nch side input stage in case an analog signal corresponding to the digital image data is higher than an intermediate voltage.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
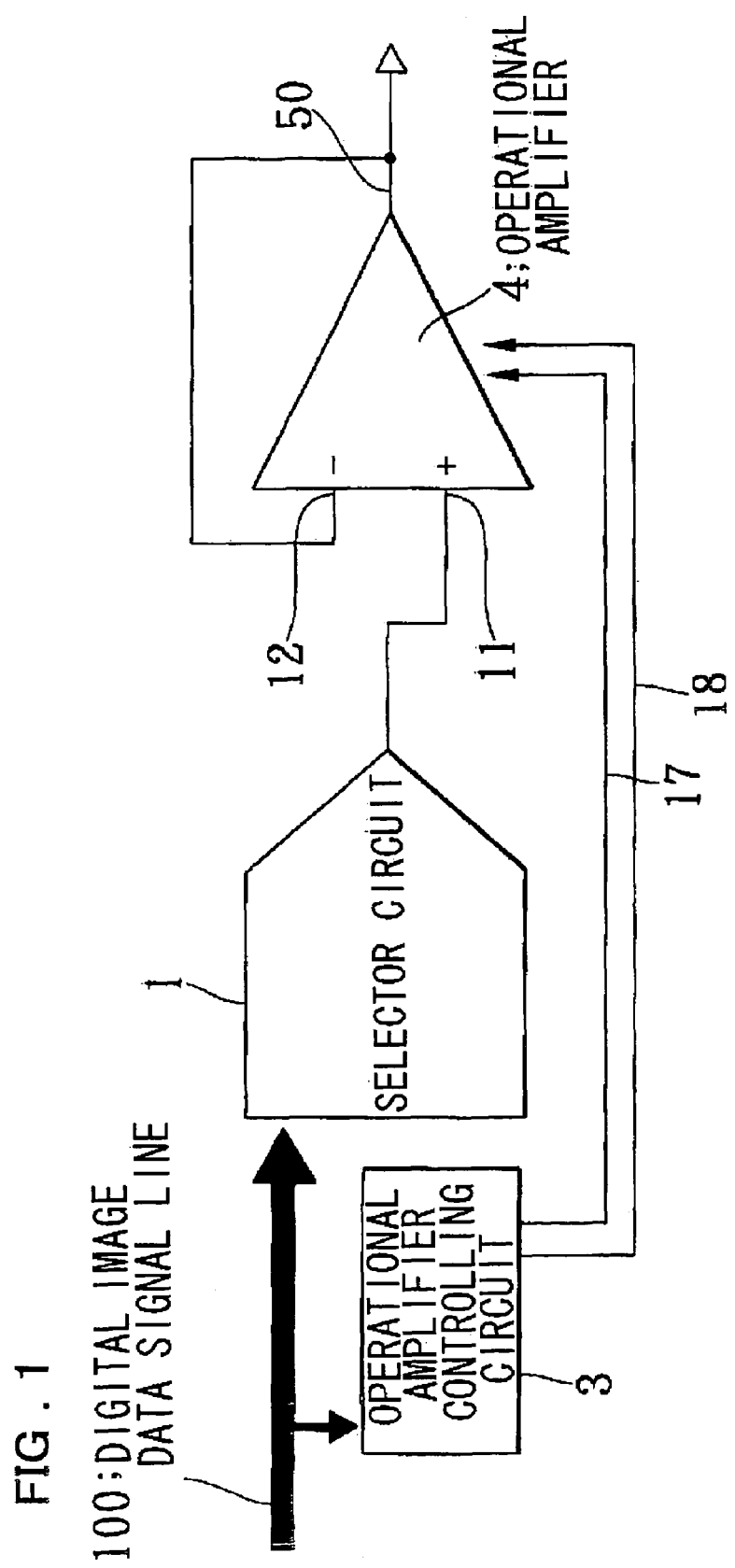
FIG. 1 is a block circuit showing the configuration of a display control circuit according to a first embodiment of the present invention.

Referring to the drawings, preferred embodiments of the present invention are explained in detail.

First Embodiment

Referring to FIG. 1, the display control circuit according to the first embodiment of the present invention includes a selector circuit 1, an operational amplifier controlling circuit 3 and an operational amplifier 4.

The selector circuit 1 is connected to a digital image data signal line 100 to output an analog voltage corresponding to an input digital image data.

The operational amplifier controlling circuit 3 is connected to the digital image data signal line 100, and outputs control signals 17, 18 which, responsive to digital image data, entered from the digital image data signal line, and which is made up by grayscale data having a width of plural bits, become "H" (high level) and "L" (low level) if the most significant bit of the digital image data signal is 1 and 0, respectively.

Figure 11:
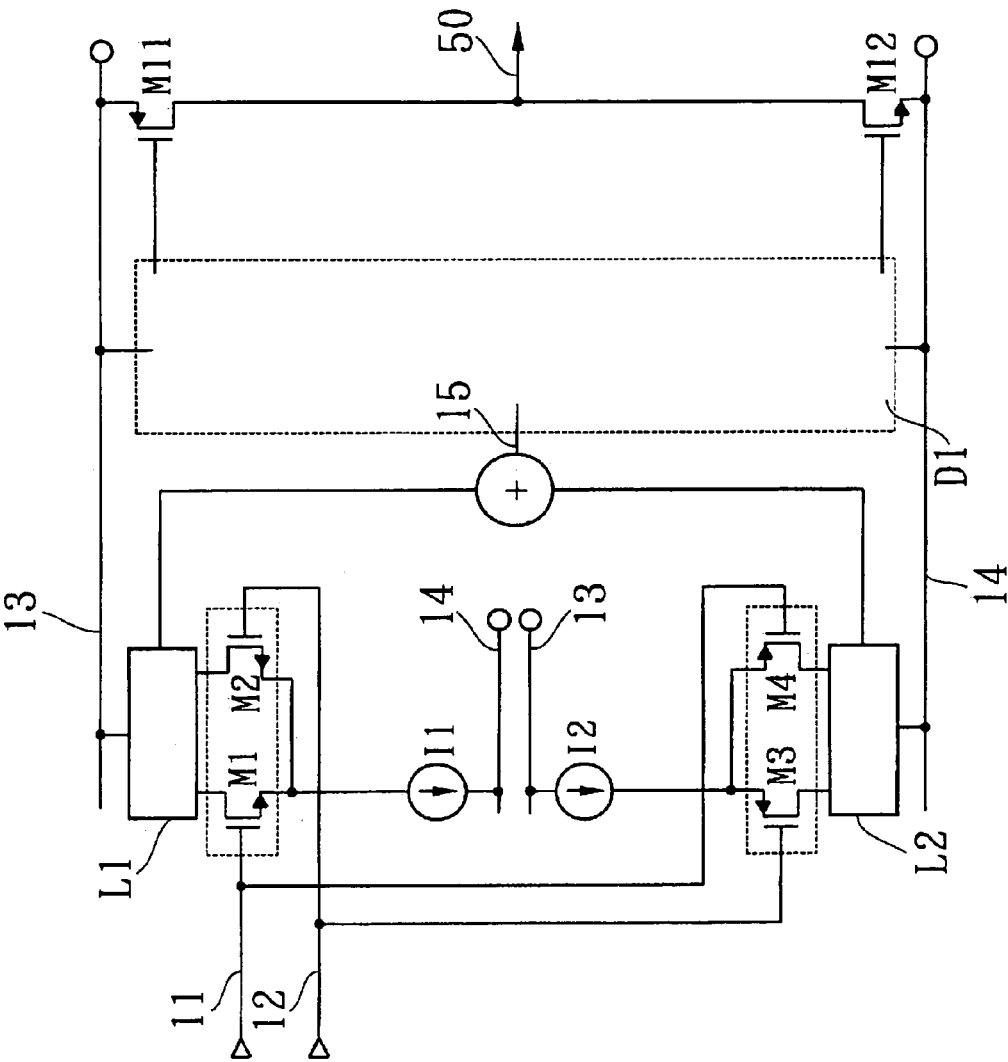
FIG. 11 shows a first illustrative configuration of an operational amplifier in the conventional display control circuit.
Figure 12:
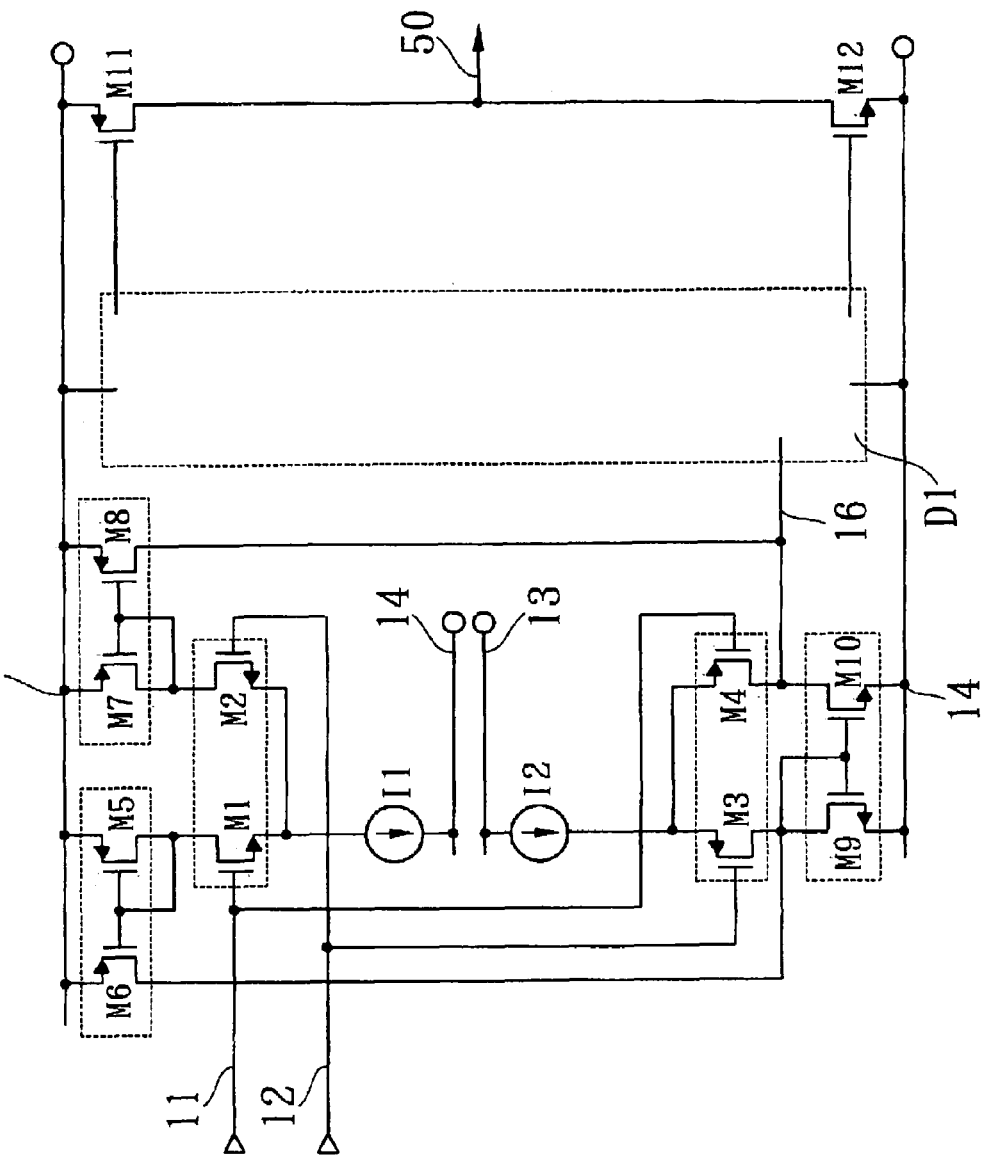
FIG. 12 shows a second illustrative configuration of an operational amplifier in the conventional display control circuit.

The operational amplifier 4 is similar in the structure and functions to the conventional operational amplifier shown in FIGS. 11 and 12, except that a Pch side input stage constant current source circuit 11 and an Nch side input stage constant current source circuit 12 are controllable so as to be on or off, responsive to the control signals 17, 18 from the operational amplifier controlling circuit 3.

Figure 2:
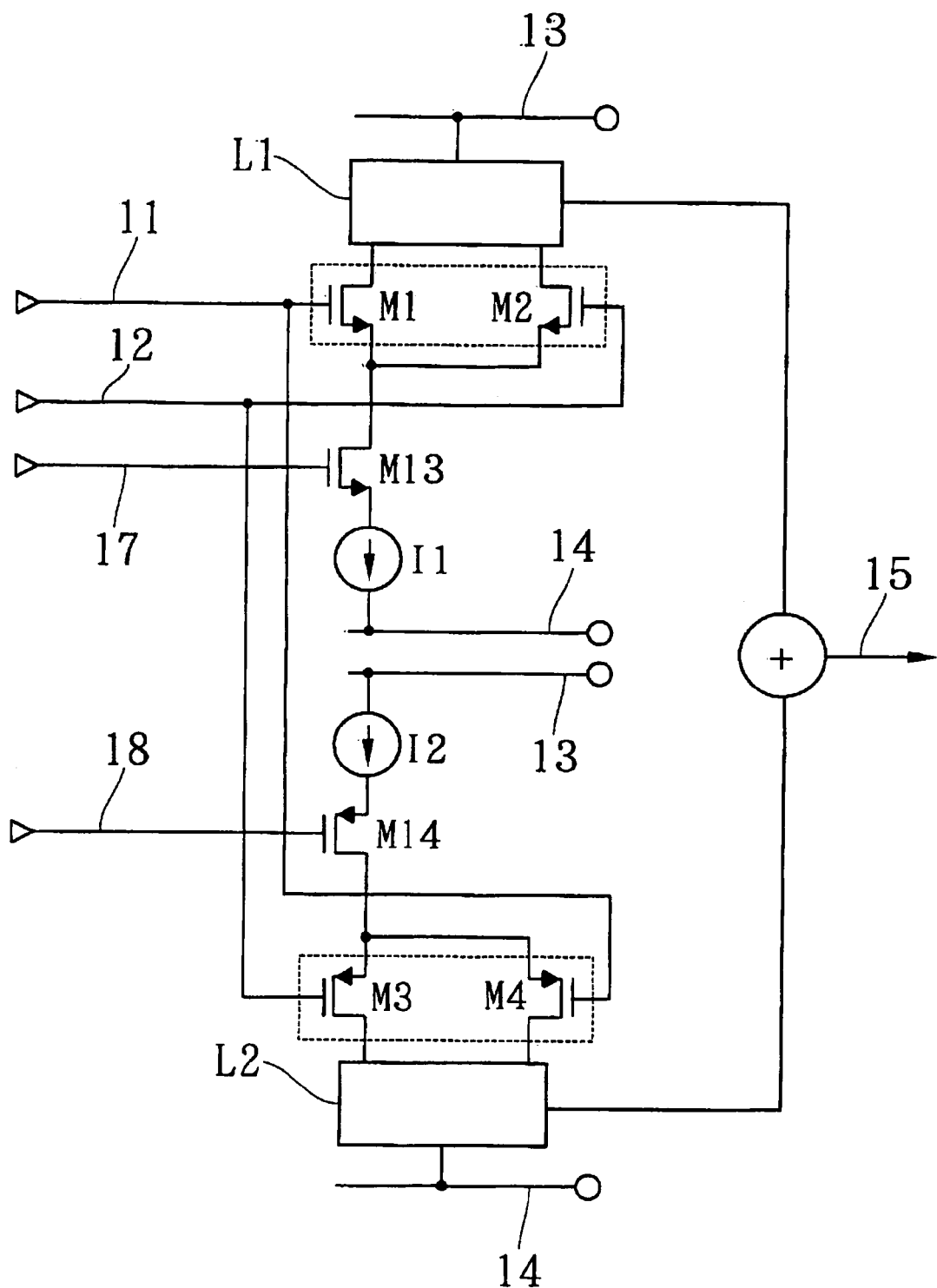
FIG. 2 is a circuit diagram showing a first illustrative configuration of the operational amplifier in the display control circuit of the present invention.

In FIG. 2 only the input stage of a first example of the operational amplifier in the display control circuit according to the present embodiment is shown.

The operational amplifier according to this embodiment includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, an Nch transistor M13, having a drain connected to sources of the Nch transistors M1 and M2, connected common, and having a gate connected to a control signal input terminal 17, a first constant current source 11, connected across a source of the Nch transistor M13 and a low potential side power supply terminal 14, a Pch transistor M14, having a drain connected to sources of the Pch transistors M3 and M4, connected common, and having a gate connected to a control signal input terminal 18, and a second constant current source I2, connected across a source of the Pch transistor M14 and a high potential side power supply terminal 13. The operational amplifier of the embodiment illustrated also includes a first load circuit L1, connected across the drains of the Nch transistors M1 and M2 and the high potential side power supply terminal 13, and a second load circuit L2, connected across the drains of the Pch transistors M3 and M4 and the low potential side power supply terminal 14.

The operation of the operational amplifier, shown in FIG. 2, is hereinafter explained.

In the operational amplifier, shown in FIG. 2, the same reference numerals are used to depict the parts or components having the same function as that of the conventional operational amplifier, shown in FIG. 11. These parts or components perform the operation which is the same as that of the conventional operational amplifier shown in FIG. 11.

If, for example, an analog signal corresponding to digital data on the digital image data signal line 100 is higher than an intermediate voltage, the input terminals 11 and 12 of the operational amplifier generate high level signals and the control signal input terminals 17 and 18 are both at high level, such that, by virtue of the Nch transistor M13 and the Pch transistor M14, the constant current source I1 of the Nch side input stage is rendered active, while the constant current source I2 of the Pch side input stage is shut off.

If conversely the analog signal corresponding to the digital data on the digital image data signal line 100 is lower than an intermediate voltage, the input terminals 11 and 12 of the operational amplifier generate low level signals the control signal input terminals 17 and 18 are both at low level, such that, by the Nch transistor M13 and the Pch transistor M14, the constant current source I1 of the Nch side input stage is shut off, while the constant current source I2 of the Pch side input stage is rendered active.

Thus, in the operational amplifier, shown in FIG. 2, the Nch input stage and the Pch input stage are formed by the combination of differential transistor pairs of opposite conductivity types, thus allowing for a full range input by complementary operation. By the Nch transistor m13 and the Pch transistor M14, control is managed at all times so that only one of the constant current sources I1 and I2 is in operation. Hence, it becomes possible to suppress the offset voltage by suppressing changes in the current value.

Figure 3:
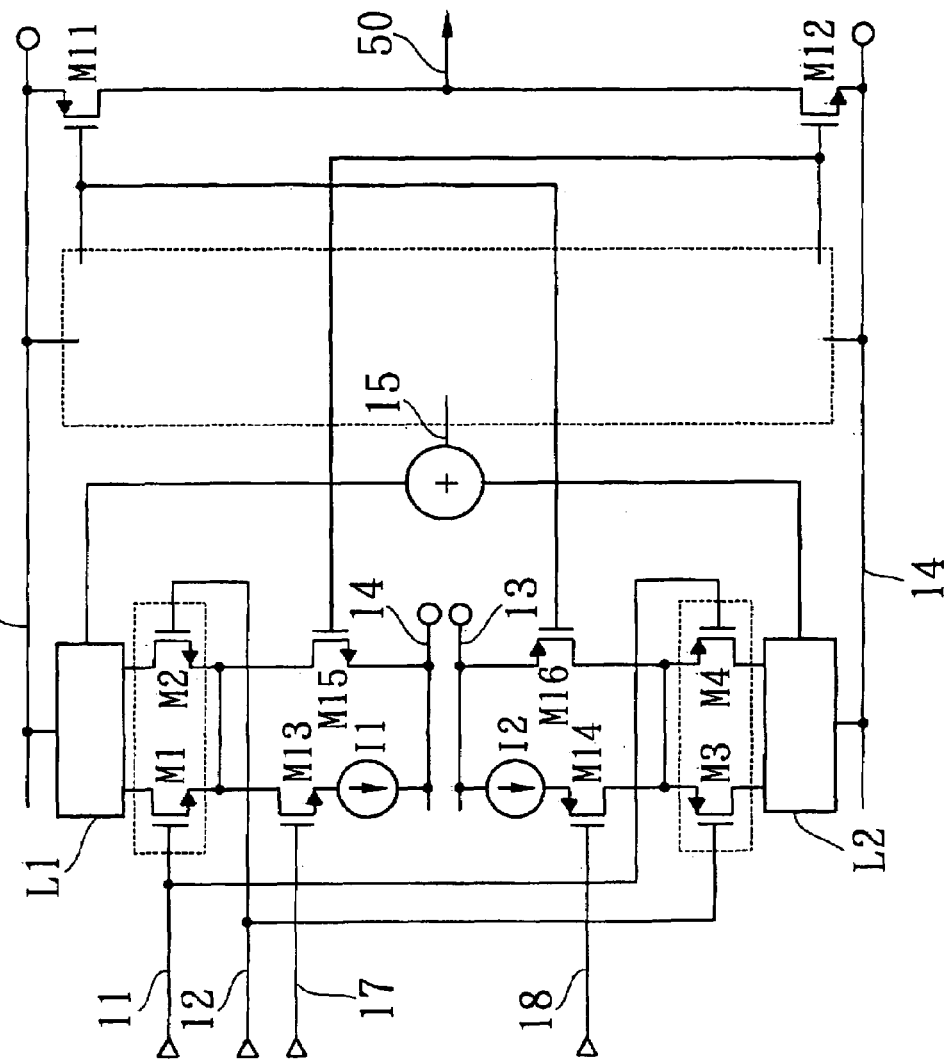
FIG. 3 is a circuit diagram showing a second illustrative configuration of the operational amplifier in the display control circuit of the present invention.

The operational amplifier of the second example in the display control circuit of the present embodiment as shown in. FIG. 3, includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, an Nch transistor M13, having a drain connected to sources of the Nch transistors M1 and M2, connected common, and having a gate connected to a control signal input terminal 17, a first constant current source I1, connected across a source of the Nch transistor M13 and a low potential side power supply terminal 14, a Pch transistor M14, having a drain connected to sources of the Pch transistors M3 and M4, connected common, and having a gate connected to a control signal input terminal 18, a second constant current source I2, connected across a source of the Pch transistor M14 and a high potential side power supply terminal 13, a first load circuit L1, connected across the drains of the Nch transistors M1 and M2 and the high potential side power supply terminal 13, and a second load circuit L2, connected across the drains of the Pch transistors M3 and M4 and the low potential side power supply terminal 14. The operational amplifier of the second illustrative structure also includes an Nch transistor M15, having a drain connected to sources of the Nch transistors M1 and M2, connected common, and having a source connected to the low potential side power supply terminal 14, a Pch transistor M16, having a drain connected to sources of the Pch transistors M3 and M4, connected common, and having a source connected to the high potential side power supply terminal 13, a Pch transistor M1 and an Nch transistor M12, together forming an output stage circuit, having sources connected to the high potential side power supply terminal 13 and to the low potential side power supply terminal 14, having drains connected common to the output terminal 50, and having gates connected to the gate of a Pch transistor M16 and to the gate of an Nch transistor M15, and a driving stage circuit D1, for level-shifting a signal 15, which is a parallel output of the outputs of the load circuits L1 and L2, and for coupling the level-shifted signal to the gates of the Pch transistor M11 and the Nch transistor M12, together forming the output stage circuit.

The operational amplifier, shown in FIG. 3, is connected in the voltage-follower configuration, as shown in FIG. 1, so that one 12 of the input terminals is connected to the output terminal 50.

The operation of the operational amplifier, shown in FIG. 3, is hereinafter explained.

In the operational amplifier, shown in FIG. 3, the same reference numerals are used to depict the parts or components having the same function as that of the conventional operational amplifier, shown in FIG. 11. The operation of these parts or components is the same as that of the conventional operational amplifier shown in FIG. 11.

The Nch transistor M13 and the Pch transistor M14 are on/off controlled, depending on whether an analog signal corresponding to the digital data on the digital image data signal line 100 is higher or lower than an intermediate voltage, in order to exercise control at all times so that only one of the constant current source I1 of the Nch side input stage and the constant current source I2 of the Pch side input stage is in operation, whereby it is possible to suppress change in the current value in the full range input to reduce the value of the offset voltage, as in the case of the operational amplifier shown in FIG. 2.

Moreover, if, in the operational amplifier, shown in FIG. 3, the voltage applied to the input terminal 11 is increased relative to that applied to the input terminal 12, the output voltage of the drain of the Nch transistor M2, forming the differential transistor pair, is lowered, and hence the gate voltages of the Pch transistor M11 of the output stage and the Pch transistor M16 of the input stage are lowered, through the driving stage circuit D1, so that the current in the Pch transistor M16 is increased. Consequently, the current flowing in the input stage is increased during the time of voltage increase of the output terminal 50.

On the other hand, if the voltage applied to the input terminal 11 is decreased relative to that applied to the input terminal 12, the output voltage of the drain of the Nch transistor M2, forming the differential transistor pair, is increased, and hence the gate voltages of the Nch transistor M12 of the output stage and the Nch transistor M15 of the input stage are increased. Hence, the current in the Nch transistor M15 is increased, so that the current flowing in the input stage is increased during the time of voltage decrease of the output terminal 50.

Thus, in the operational amplifier, including the Nch transistor N15 and the Pch transistor M16, as shown in FIG. 3, the bias current supplied to the differential transistor pair of the input stage is increased during change of the input signal, thus aiding in the voltage change at the output terminal 50. Thus, a transiently high slew rate may be achieved to speed up the operation of the operational amplifier. It is noted that such function of the operational amplifier is described in detail in e.g. the Patent Document 3.

In this manner, in the operational amplifier, shown in FIG. 3, the Nch input stage and the Pch input stage, made up by the differential pair transistors of opposite conductivity type, are tied together, thus enabling a full range input by complementary operation. Since the Pch transistor M11 and the Nch transistor M12 of the output stage perform the push-pull operations, a wide range output is possible. Moreover, by the Nch transistor M13 and the Pch transistor M14, only one of the constant current sources I1 and I2 is controlled to be in operation, so that changes in the current value in the full input range may be suppressed to suppress the voltage value of the offset voltage.

Additionally, with the present embodiment of the operational amplifier, in which the bias current supplied to the differential transistor pair of the input stage is increased during the time of changes in the signal input to aid in changes in the voltage at the output terminal 50, a transiently large slew rate may be realized to speed up the operation of the operational amplifier.

Figure 4:
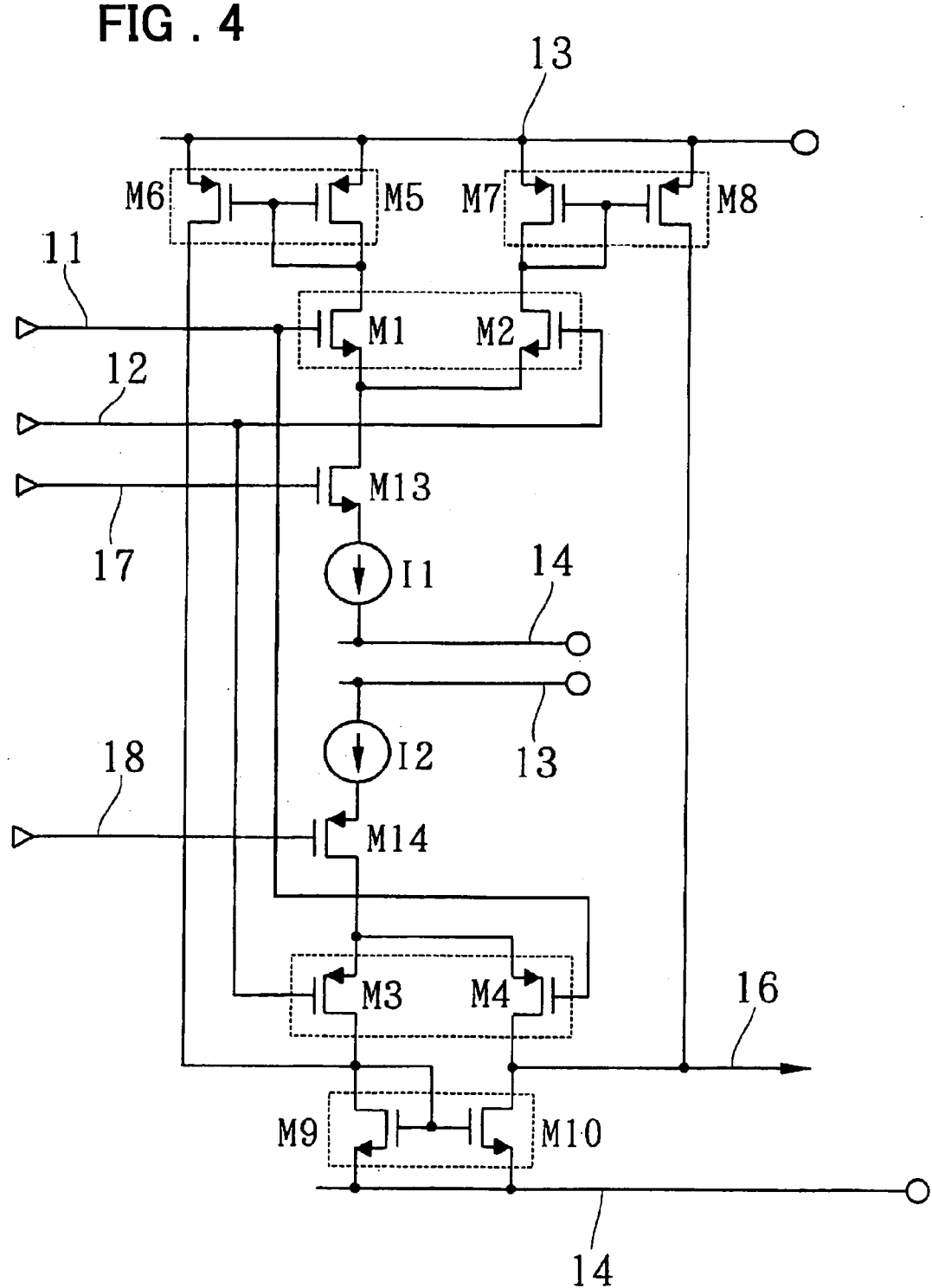
FIG. 4 is a circuit diagram showing a third illustrative configuration of the operational amplifier in the display control circuit of the present invention.

FIG. 4 shows only the input stage of a third example of the operational amplifier in the display control circuit according to the present embodiment.

The operational amplifier according to the present embodiment includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, an Nch transistor M13, having a drain connected to sources of the Nch transistors M1 and M2, connected common, and having a gate connected to a control signal input terminal 17, a first constant current source I1, connected across a source of the Nch transistor M13 and a low potential side power supply terminal 14, a Pch transistor M14, having a drain connected to sources of the Pch transistors M3 and M4, connected common, and having a gate connected to a control signal input terminal 18, a second constant current source I2, connected across a source of the Pch transistor M14 and a high potential side power supply terminal 13, a first current mirror circuit, made up by a Pch transistor M5, having a gate and a drain connected to the drain of the Nch transistor M1 and having a source connected to the high potential side power supply terminal 13, and a Pch transistor M6, having a gate connected to the gate of the Pch transistor M5, having a drain connected to the drain of the Pch transistor M3 and having a source connected to the high potential side power supply terminal 13, and a second current mirror circuit, made up by a Pch transistor M7, having a gate and a drain connected to the drain of the Nch transistor M2 and having a source connected to the high potential side power supply terminal 13, and a Pch transistor M8, having a gate connected to the gate of the Pch transistor M7, having a drain connected to the drain of the Pch transistor M4 and having a source connected to the high potential side power supply terminal 13.

The operation of the operational amplifier, shown in FIG. 4, is hereinafter explained.

In the operational amplifier, shown in FIG. 4, the same reference numerals are used to depict the parts or components having the same functions as those of the conventional operational amplifier, shown in FIG. 12. The operation of these parts or components is the same as that of the conventional operational amplifier shown in FIG. 12.

The Nch transistor M13 and the Pch transistor M14 are on/off controlled, depending on whether an analog signal corresponding to the digital data on the digital image data signal line 100 is higher or lower than an intermediate voltage, thereby managing control so that only one of the constant current source I1 of the Nch side input stage and the constant current source I2 of the Pch side input stage will be in operation, at all times, such that it is possible to suppress changes in the current value in the full range input to suppress the value of the offset voltage, as in the case of the operational amplifier shown in FIG. 2.

Thus, in the operational amplifier, shown in FIG. 4, the Nch input stage and the Pch input stage are formed by differential transistor pairs of opposite conductivity types, tied together, thus allowing for full range input by complementary operation. By virtue of the Nch transistor M13 and the Pch transistor M14, only one of the constant current sources I1 and I2 is controlled to be in operation at all times. Thus, by suppressing change in the current value in the full input range, it becomes possible to reduce the value of the offset voltage.

Moreover, the drain of the Nch transistor M1, forming a differential pair, and the drain of the Pch transistor M3, forming another differential pair, are connected together in a mirror configuration via the current mirror circuit formed by the Pch transistors M5 and M6, while the drain of the Nch transistor M2, forming a differential pair, and the drain of the Pch transistor M4, forming another differential pair, are connected together in a mirror configuration via the current mirror circuit formed by the Pch transistors M7 and M8, so that the bias current of the input stage may be instantaneously increased only when the slew rate is required, thereby enabling the charging or discharge rate to be increased without increasing the steady-state current.

Moreover, the operational amplifier, shown in the Patent Documents 2 or 3, lacks in the function corresponding to that of the Nch transistor M13 or the Pch transistor M14, as in the present embodiment, such that a constant current is caused to flow at all times through the input stage. Thus, in the intermediate input range, in which both the Nch input stage and the Pch input stage are turned on, the d.c. gain of the input stage is increased, so that a large quantity of current has to be supplied to the driving stage for stabilizing the operation. In the present embodiment of the operational amplifier, one of the input stages is turned off at all times, so that the d.c. gain of the input stage is not increased, and hence the current supplied to the input stage may be decreased. Thus, in the present embodiment of the operational amplifier, the current consumption may be decreased by approximately 25% as compared to that of the operational amplifier disclosed in the Patent Document 3.

Figure 5:
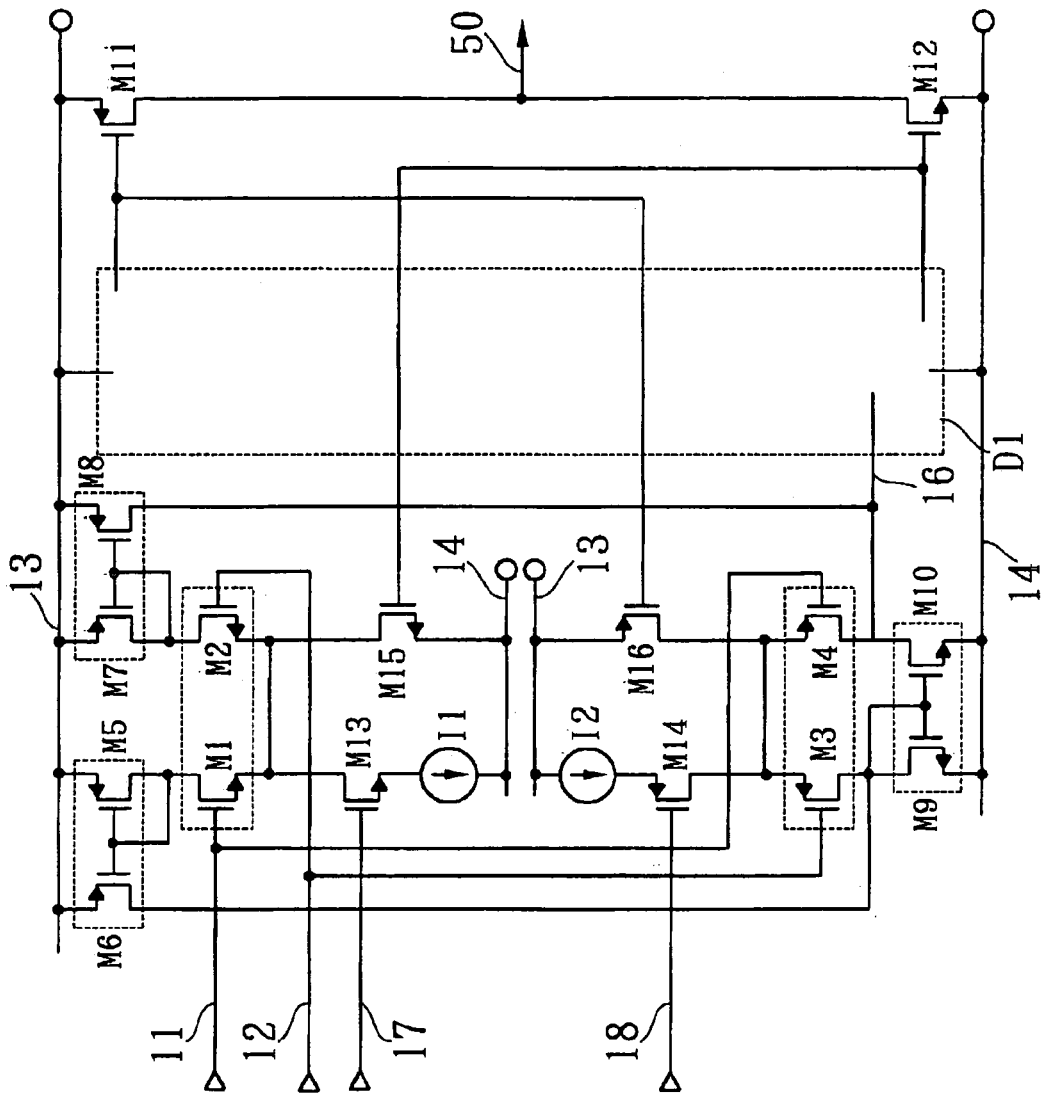
FIG. 5 is a circuit diagram showing a fourth illustrative configuration of the operational amplifier in the display control circuit of the present invention.

Referring to FIG. 5, the operational amplifier of a fourth illustrative structure in the display control circuit in the display control circuit of the instant embodiment includes Nch transistors M1 and M2, forming a differential transistor pair, having sources connected common and having gates connected to input terminals 11 and 12, respectively, Pch transistors M3 and M4, forming a differential transistor pair, having sources connected common and having gates connected to input terminals 12 and 11, respectively, an Nch transistor M13, having a drain connected to sources of the Nch transistors M1 and M2, connected common, and having a gate connected to a control signal input terminal 17, a first constant current source I1, connected across a source of the Nch transistor M13 and a low potential side power supply terminal 14, a Pch transistor M14, having a drain connected to sources of the Pch transistors M3 and M4, connected common, and having a gate connected to a control signal input terminal 18, and a second constant current source I2, connected across a source of the Pch transistor M14 and a high potential side power supply terminal 13. The operational amplifier of the fourth illustrative structure also includes a first current mirror circuit, made up by a Pch transistor M5, having a gate and a drain connected to the drain of the Nch transistor M1 and having a source connected to the high potential side power supply terminal 13, and a Pch transistor M6, having a gate connected to the gate of the Pch transistor M5, having a drain connected to the drain of the Pch transistor M3 and having a source connected to the high potential side power supply terminal 13, and a second current mirror circuit, made up by a Pch transistor M7, having a gate and a drain connected to the drain of the Nch transistor M2 and having a source connected to the high potential side power supply terminal 13, and a Pch transistor M8, having a gate connected to the gate of the Pch transistor M7, having a drain connected to the drain of the Pch transistor M4 and having a source connected to the high potential side power supply terminal 13. The operational amplifier of the fourth illustrative structure also includes a load circuit, made up by. Nch transistors M9 and M10, connected across the drains of the Pch transistors M3 and M4 and the low potential side power supply terminal 14, a Pch transistor M11 and an Nch transistor M12, forming an output stage circuit, each having a source connected to the high potential side power supply terminal 13 and the low potential side power supply terminal 14 and having a drain connected common to the output terminal 50, and a driving stage circuit D1 for level-shifting a signal 16 from the drain of the Nch transistor M10 of the load circuit for coupling the level-shifted signal to the gate of the Pch transistor M11 and the Nch transistor M12 of the output stage circuit.

The operational amplifier, shown in FIG. 5, is connected in the voltage-follower configuration, as shown in FIG. 1, so that one 12 of the input terminals is connected to the output terminal 50.

The operation of the operational amplifier, shown in FIG. 5, is hereinafter described.

In the operational amplifier, shown in FIG. 5, the same reference numerals are used to depict the parts or components having the same function as that of the conventional operational amplifier, shown in FIG. 4. The operation of these parts or components is the same as that of the conventional operational amplifier shown in FIG. 4.

In the operational amplifier shown in FIG. 5, the N-channel transistor M15, having a gate connected to the gate of the Nch transistor M12 of the output stage circuit, is connected across the sources of the Nch transistors M1 and M2 of the differential pair, connected common, and the low potential side power supply terminal 14, while the Pch transistor M16, having a gate connected to the gate of the P-channel transistor M11 of the output stage circuit, is connected across the sources of the Pch transistors M3 and M4 of the differential pair, connected common, and the high potential side power supply terminal 13. The current flowing through the Pch transistor M16 or the Nch transistor M15 is increased, in keeping with the rise or fall of the voltage applied to the input terminal 11 as compared to that applied to the input terminal 12, and hence the current flowing through the input stage circuit is increased only during the voltage rise period or the voltage decreasing period of the output terminal 50. Thus, the bias current supplied to the differential transistor pair of the input stage is increased during change of the input signal, thus aiding in the voltage change at the output terminal 50. Thus, a transiently high slew rate may be achieved to speed up the operation of the operational amplifier, as in the case of the operational amplifier shown in FIG. 3.

In this manner, in the operational amplifier, shown in FIG. 5, the Nch input stage and the Pch input stage, made up by the differential pair transistors of opposite conductivity types, are tied together, thus enabling a full range input by complementary operation. Since the Pch transistor M11 and the Nch transistor M12 of the output stage perform the push-pull operations, a wide range output is possible. Furthermore, by virtue of the Nch transistor M13 and the Pch transistor M14, only one of the constant current sources I1 and I2 is controlled to be in operation, at all times, so that change in the current value in the full input range may be suppressed to reduce the voltage value of the offset voltage.

Additionally, with the present embodiment of the operational amplifier, provided with the Nch transistor M15 and the Pch transistor M16, the bias current supplied to the differential transistor pair of the input stage is increased during the time of changes in the signal input to aid in changes in the voltage at the output terminal 50, and hence a transiently large slew rate may be realized to speed up the operation of the operational amplifier.

Moreover, since the drain of the Nch transistor M1, forming a differential pair, and the drain of the Pch transistor M3, forming another differential pair, are connected in a mirror configuration via the current mirror circuit formed by the Pch transistors M5 and M6, and the drain of the Nch transistor M2, forming a differential pair, and the drain of the Pch transistor M4, forming another differential pair, are connected in a mirror configuration via the current mirror circuit formed by the Pch transistors M7 and M8, it is possible to raise the charging or discharge rate, without increasing the steady-state current, by instantaneously increasing the bias current of the input stage circuit only when the slew rate is required.

Meanwhile, since one of the input stages is turned off at all times, and hence the d.c. gain of the input stage is not increased, so that the current supplied to the input stage may be decreased. Thus, as in the case of the operational amplifier, shown in FIG. 4, the current consumption may be decreased by approximately 25% as compared to that of the operational amplifier disclosed in the Patent Document 3.

Second Embodiment

With references to FIG. 6 to 9, a second embodiment of the present invention will be described in the below.

Figure 6:
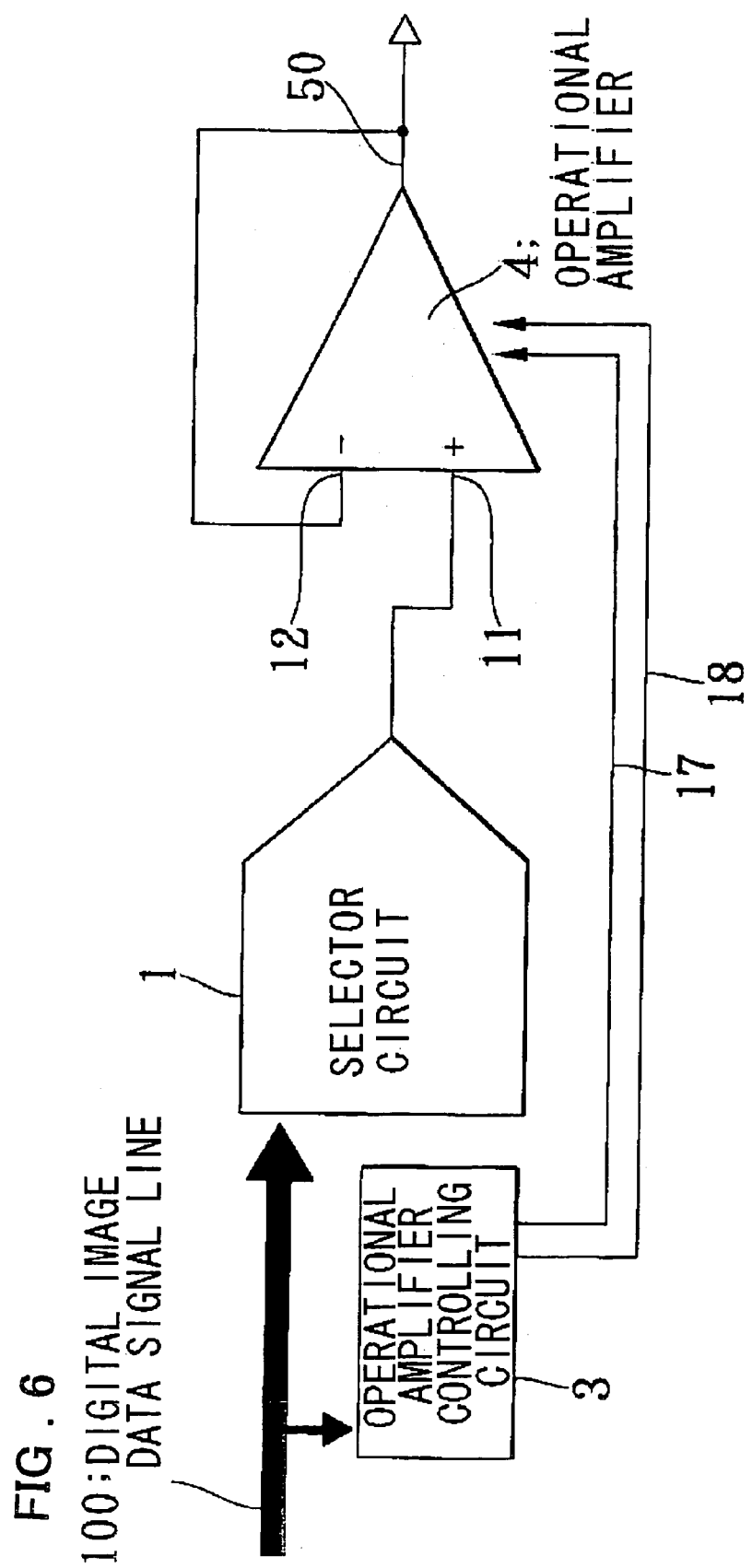
FIG. 6 is a block diagram showing the configuration of a display control circuit according to a second embodiment of the present invention.

Referring to FIG. 6, the display control circuit according to the present embodiment includes a selector circuit 1, an operational amplifier controlling circuit 3 and an operational amplifier 5.

Of these, the selector circuit 1 and the operational amplifier controlling circuit 3 are the same as those of the first embodiment shown in FIG. 1.

The operational amplifier 5 is similar in the structure and functions to the operational amplifier 4, shown in FIG. 1, except that switches 21 and 22 and switches 23 and 24, controlled to be on or off by a switching signal 19, are provided across a signal input side and a signal input/output side.

The switching signal 19 is entered from an external control circuit, not shown, and has its state changed over between "H" and "L", in writing a picture on a panel module; such as a liquid crystal or organic EL panel module, from one frame or from one line of the display to another.

Figure 7:
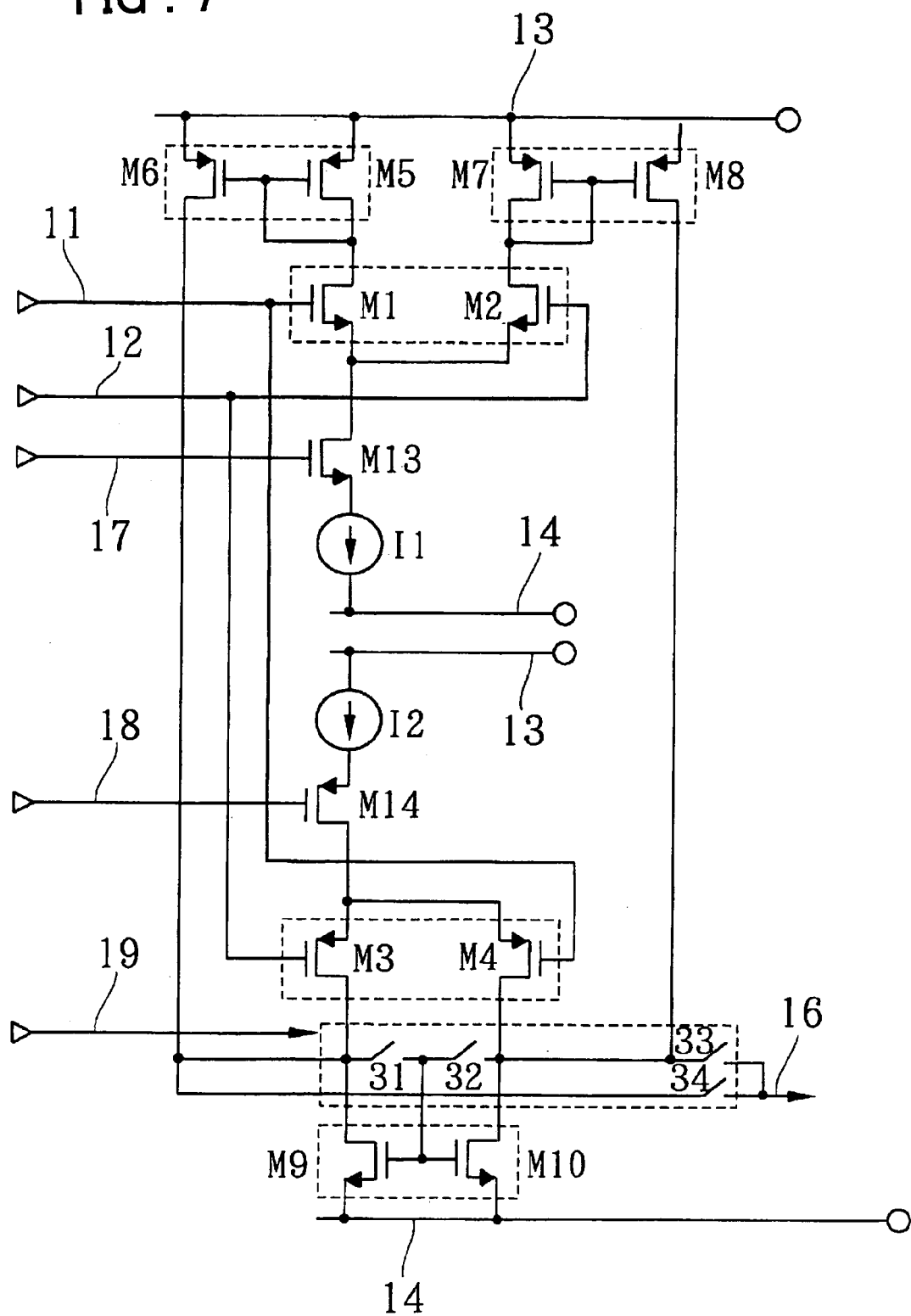
FIG. 7 is a circuit diagram showing a first illustrative configuration of an operational amplifier in the display control circuit of the present embodiment.

The operational amplifier of the first example in the display control circuit, shown in FIG. 7, is similar in structure to the operational amplifier shown in FIG. 4, except that switches 31 and 32 and switches 33 and 34, changed over by the switching signal 19, are provided across the drains of the Pch transistors M3 and M4 forming the differential pair.

For example, if the switching signal 19 in the operational amplifier shown in FIG. 7 is "H", the switches 21 and 23 outside the operational amplifier are turned off, and the switches 22 and 24 outside the operational amplifier are turned on, while the switches 31 and 34 inside the operational amplifier are turned on and the switches 32 and 33 inside the operational amplifier are turned off. The state of connection in this case is the same as that of the operational amplifier shown in FIG. 4, with the operation of the operational amplifier also being the same.

If conversely the switching signal 19 is "L", the switches 21 and 23 outside the operational amplifier are turned on, and the switches 22 and 24 outside the operational amplifier are turned off, while the switches 31 and 34 inside the operational amplifier are turned off and the switches 32 and 33 inside the operational amplifier are turned on. The state of connection in this case is such that, in the operational amplifier, shown in FIG. 4, the connection to the input terminals 11, 12 of the differential pair of the Nch transistors and the differential pair of the Pch transistors is interchanged.

Such interchanged connection of the Nch input stage and the Pch input stage to the signal input terminals by the switching signal 19 gives rise to a favorable effect that an error of output characteristics (error in linearity) of the Nch input stage and the Pch input stage against changes in the input level can apparently be reduced.

Figure 8A:
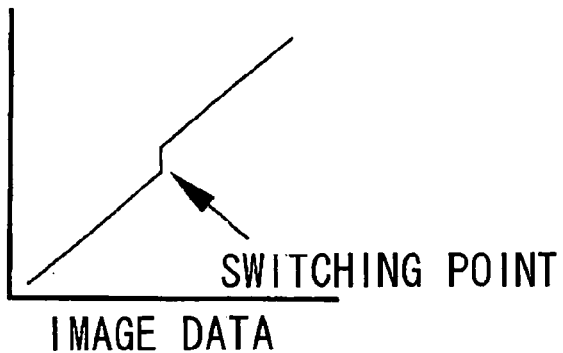
FIGS. 8A, 8B and 8C illustrate the effect of interchanging the Nch input stage and the Pch input stage by a switching signal.
Figure 8B:
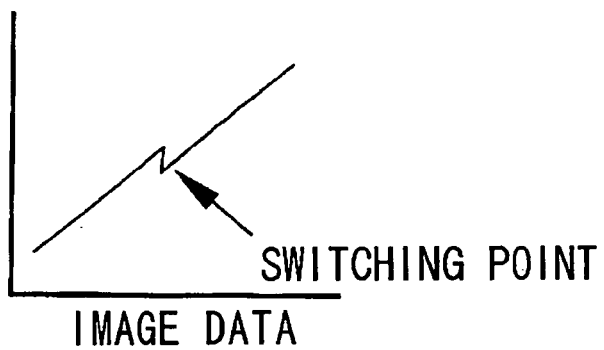
Figure 8C:
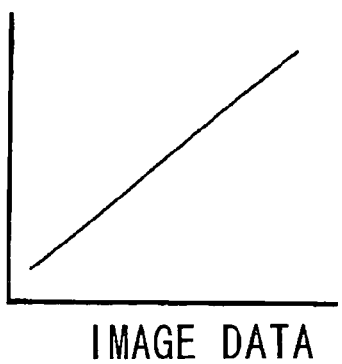

In FIGS. 8A-8B and 8C, there are illustrated favorable effects of the interchanging of the Nch input stage and the Pch input stage by the switching signal.

FIG. 8A shows the relation between the image data and the output voltage in case the switching signal 19 is "H", and specifically shows that output voltage characteristics are changed with the case of the input level being the intermediate voltage as a switching point.

FIG. 8B shows the relation between the image data and the output voltage in case the switching signal 19 is "L", and specifically shows that output voltage characteristics are changed with a tendency reverse to that in the case of FIG. 8A, with the input level being the intermediate voltage as a switching point.

Such error in linearity is caused by an error (imbalance) in performance, produced due e.g. o an error in dimensional accuracy of each transistor in the manufacture process of the operational amplifier. Such error is mostly produced due to manufacture tolerances of the input differential pairs.

Thus, by interchanging the connection of the input differential pairs to the input terminals 11 and 12 at a suitable time interval, it is possible to average out such error to apparently decrease the error of the output characteristics of the Nch input stage and the Pch input stage against changes in the input level.

FIG. 8C shows the relationship between image data and output voltage characteristics in case the connection of the input differential pairs is interchanged. It may be seen from this figure that changes in the output voltage characteristics derived from the error in the performance of the input differential pairs are averaged out such as to improve the apparent linearity.

That is, with the present embodiment of the operational amplifier, the favorable result comparable to that of the operational amplifier shown in FIG. 4 may be obtained, while the deterioration in the linearity, ascribable to manufacture tolerances of the input differential pairs may be eked out to improve the picture quality.

Figure 9:
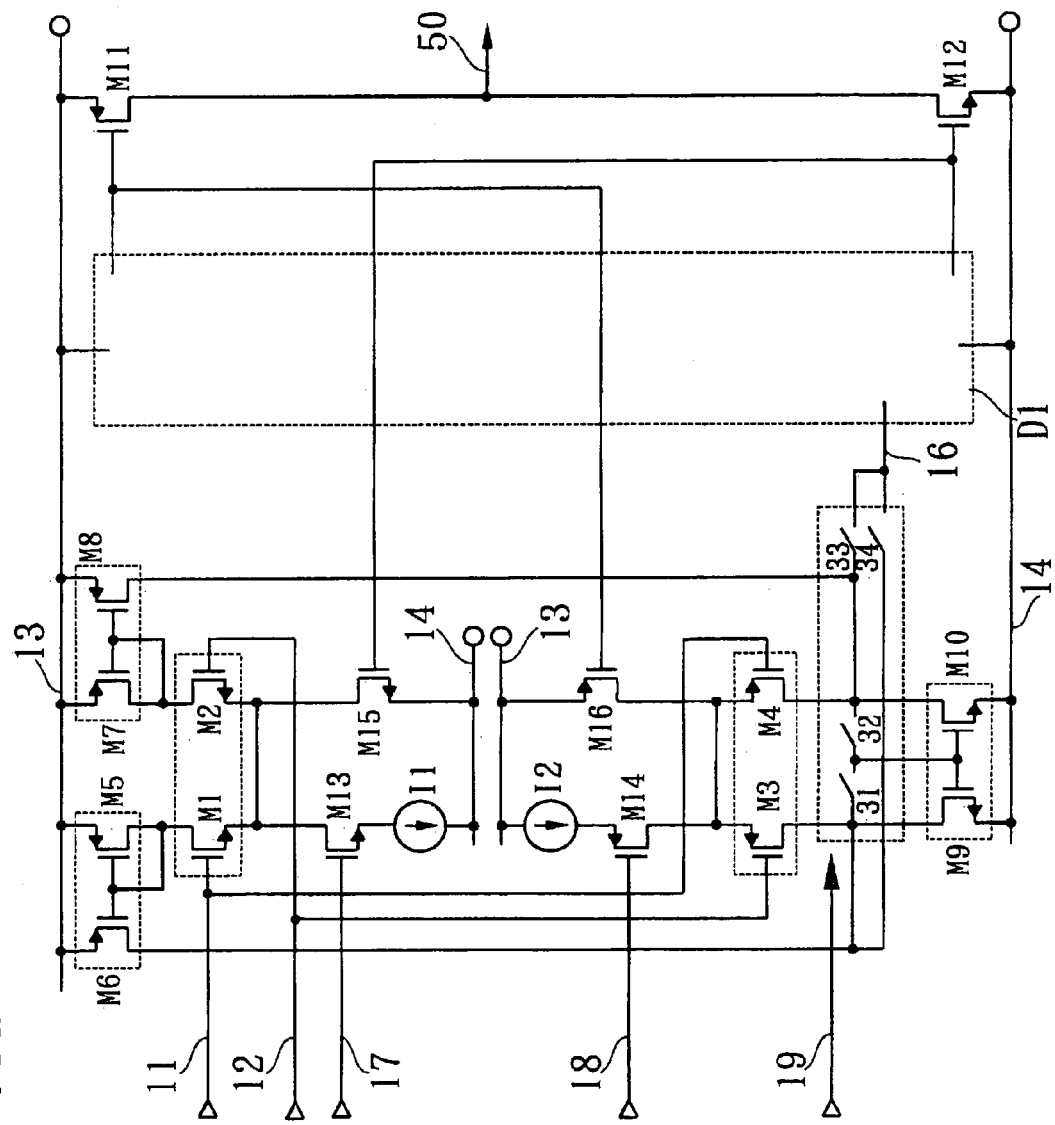
FIG. 9 is a circuit diagram showing a second illustrative configuration of an operational amplifier in the display control circuit of the present embodiment.
Figure 10:
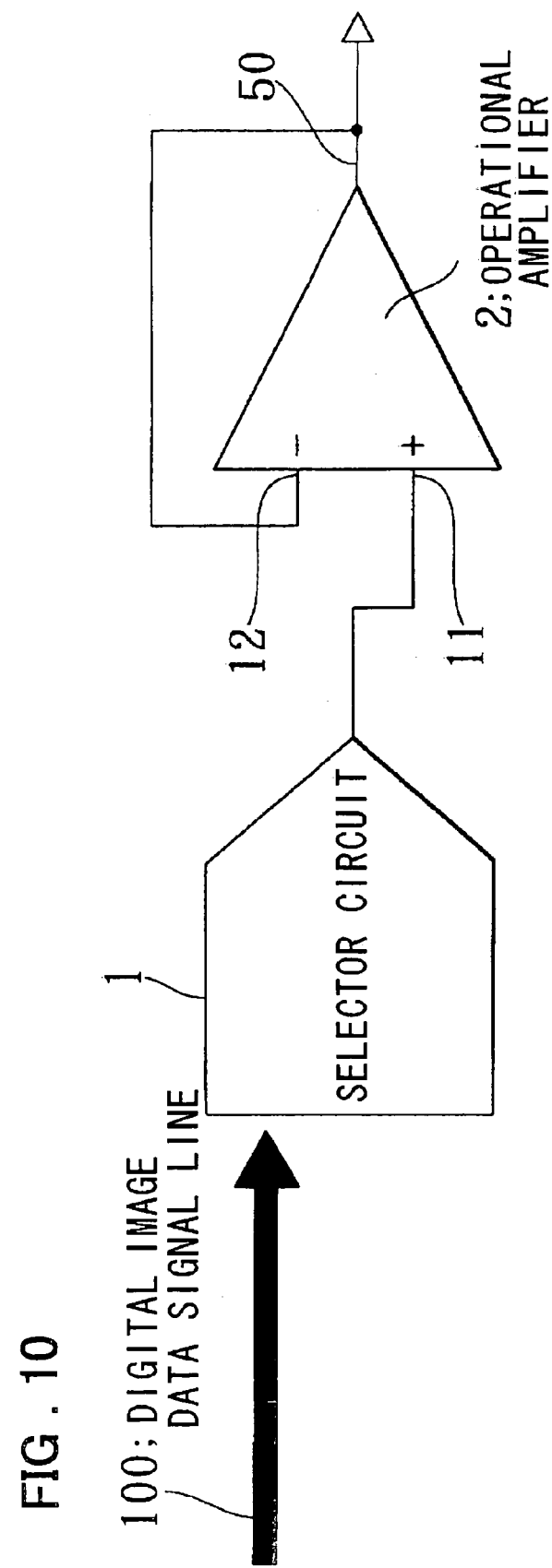
FIG. 10 shows an illustrative configuration of a conventional display control circuit.

The operational amplifier shown in FIG. 9 is similar in the structure to the operational amplifier shown in FIG. 5, except that switches 31 and 32 and switches 33 and 34, controlled to be on or off by a switching signal 19, are provided across the drains of the Pch transistors M3 and M4 forming the differential pair.

In the operational amplifier, shown in FIG. 9, the operation and the favorable effect of the switches 31 and 32 and the witches 33, 34, changed over by the switching signal 19, are similar to those of the operational amplifier shown in FIG. 7.

That is, by interchanging the connection of the Nch input stage and the Pch input stage to the input terminals 11 and 12, it is possible to apparently decrease the error (error in linearity) of the Nch input stage and the Pch input stage against changes in the input level.

Thus, in the present embodiment of the operational amplifier, the favorable effect similar to that of the operational amplifier shown in FIG. 5 is obtained, while the deterioration in the linearity, ascribable to manufacture tolerances of the input differential pairs, may be eked out to improve the picture quality.

Although certain preferred embodiment of the present invention have so far been elucidated with reference to the drawings, the concrete structure is not limited to the embodiments illustrated, such that changes in design which do not depart from the purport of the present invention are encompassed by the present invention. For example, it is apparent that, in the operational amplifier in each of the above-described illustrative structures, the conductivity type of each transistor or the polarity of each constant current source, for example, may be reversed to provide a complementary circuit to realize an operational amplifier having the comparable effect and a display control circuit exploiting the operational amplifier. It is also apparent that the differential pair may be formed by bipolar transistors, instead of by field effect transistors. In addition, in the operational amplifier controlling circuit in each of the above-described embodiments, the polarity of the control signal may be determined by verifying whether the grayscale data is larger or smaller than a preset intermediate value, instead of by determining the output polarity of the control signal from polarity data.

The meritorious effects of the present invention are summarized as follows.

With the display control circuit, according to the first embodiment of the present invention, described above, the operational amplifier is made up by two input stages of respective opposite conductivity types, a full range inputting is possible by complementary operation. Moreover, since the output stage performs push-pull operations, an output with a broad output range may be achieved.

Moreover, only one of the constant current sources of the two input stages is controlled to be in operation, at all times, and hence the offset voltage may be suppressed to a lower value by suppressing changes in the current in the full range. Additionally, the current supplied to the input stage may be decreased without increasing the d.c. gain of the input stage to decrease the current consumption. Furthermore, the bias current supplied to the differential pair of the input stage circuit is increased to aid in voltage changes during changes in the signal input, and hence a transiently large slew rate ma be achieved to enable the operational speed to be increased. By momentarily increasing the bias current of the input stage only when the slew rate is required, the charging/discharge rate may be increased without increasing the steady-state current.

With the display control circuit, according to the second embodiment of the present invention, it is possible to achieve the favorable effect similar to that in the first embodiment, while it is also possible to average out the non-equilibrium in the performance of the input differential pair, ascribable to manufacture tolerances in the operational amplifier, thereby apparently eking out the deterioration in the linearity of the output characteristics against changes in the input level to improve the picture quality.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A display control circuit comprising:
   a selector circuit being connected to a digital image data signal line and outputting an analog signal of a magnitude corresponding to input digital image data;
   an operational amplifier control circuit being connected to the digital image data signal line and generating and outputting a control signal having a polarity corresponding to the input digital image; and
   an operational amplifier including:
   a first input stage and a second input stage, made up of differential transistor pairs of respective opposite conductivity types; and
   a first constant current source and a second constant current source supplying respective bias currents to the first input stage and the second input stage; the first constant current source and the second constant current source being controlled to be selectively turned on depending on the polarity of the control signal.

2. The display control circuit according to claim 1, wherein said operational amplifier includes:
- a first differential transistor pair and a second differential transistor pair of respective opposite conductivity types, having control electrodes connected to a first input terminal and to a second input terminal, respectively, and having second electrodes connected common;
- said first constant current source having one end connected to a second power supply terminal and said second constant current source having one end connected to a first power supply terminal, respectively;
- a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources, respectively, and having control electrodes supplied with said control signal; and
- a first load circuit connected across the first electrodes of said first and second differential transistor pairs and said first power supply terminal and a second load circuit connected across the first electrodes of said first and second differential transistor pairs and said second power supply terminal.

3. The display control circuit according to claim 1, wherein said operational amplifier includes:
- a first differential transistor pair and a second differential transistor pair of respective opposite conductivity types, having control electrodes connected to a first input terminal and to a second input terminal, respectively, and having second electrodes connected common;
- said first constant current source having one end connected to a second power supply terminal and said second constant current source having one end connected to a first power supply terminal, respectively;
- a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources and having control electrodes supplied with said control signal;
- a first load circuit connected across the first electrodes of said first and second differential transistor pairs and said first power supply terminal and a second load circuit connected across the first electrodes of said first and second differential transistor pairs and said second power supply terminal;
- a third transistor and a fourth transistor of opposite conductivity types, said third transistor being connected across the second electrodes, connected common, of the first differential transistor pair, and said second power supply terminal, and said fourth transistor being connected across the second electrodes, connected common, of the second differential transistor pair, and said first power supply terminal;
- a fifth transistor and a sixth transistor of opposite conductivity types, having first electrodes connected common to an output terminal and having second electrodes connected to said first and second power supply terminals, respectively, said fifth and sixth transistors performing push-pull operations by inputs to respective control terminals; and
- a driving circuit for level-shifting a signal supplied parallel from said first and second load circuits to supply the level-shifted signals to the control electrodes of said fifth and sixth transistors.

4. The display control circuit according to claim 1, wherein said operational amplifier includes:
- a first differential transistor pair and a second differential transistor pair of respective opposite conductivity types, having control electrodes connected to a first input terminal and to a second input terminal, respectively, and having second electrodes connected common;
- said first constant current source having one end connected to a second power supply terminal and said second constant current source having one end connected to a first power supply terminal;
- a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources and having control electrodes supplied with said control signal;
- a first current mirror circuit connected across an output end of said first differential transistor pair and an output end of said second differential transistor pair on one hand and said first power supply terminal on the other hand;
- a second current mirror circuit connected across the other output end of said first differential transistor pair and the other output end of said second differential transistor pair on one hand and said first power supply terminal on the other hand; and
- a seventh transistor and an eighth transistor, having one first electrode connected to one output end of said second differential transistor pair and to said first current mirror circuit and having the other first electrode connected to the other output end of said second differential transistor pair and to said second current mirror circuit, said seventh and eighth transistors having respective second electrodes connected to said second power supply terminal, said seventh and eighth transistors having control electrodes connected in common with said one first electrode.

5. The display control circuit according to claim 1, wherein said operational amplifier includes:
- a first differential transistor pair and a second differential transistor pair of respective opposite conductivity types, having control electrodes connected to a first input terminal and to a second input terminal, respectively, and having second electrodes connected common;
- said first constant current source having one end connected to a second power supply terminal and said second constant current source having one end connected to a first power supply terminal;

a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources and having control electrodes supplied with said control signal;

a first current mirror circuit connected across an output end of said first differential transistor pair and an output end of said second differential transistor pair on one hand and said first power supply terminal on the other hand;

a second current mirror circuit connected across the other output end of said first differential transistor pair and the other output end of said second differential transistor pair on one hand and said first power supply terminal on the other hand;

a third transistor and a fourth transistor of respective opposite conductivity types, said third transistor being connected across the second electrodes of the first differential transistor pair, connected common, and said second power supply terminal, and said fourth transistor being connected across the second electrodes of the second differential transistor pair, connected common, and said first power supply terminal;

a fifth transistor and a sixth transistor of respective opposite conductivity types, having first electrodes connected common to an output terminal and having second electrodes to said first and second power supply terminals, respectively, said fifth and sixth transistors performing push-pull operations responsive to inputs to respective control terminals;

a seventh transistor and an eighth transistor, having one first electrode connected to one output end of said second differential transistor pair and to said first current mirror circuit and having the other first electrode connected to the other output end of said second differential transistor pair and to said second current mirror circuit, said seventh and eighth transistors having respective second electrodes connected to said second power supply terminal, said seventh and eighth transistors having common-connected control electrodes connected to said one first electrodes; and a driving circuit for level-shifting a signal supplied parallel from said first and second load circuits to supply the level-shifted input signals to the control electrodes of said fifth and sixth transistors.

6. The display control circuit according to claim 1, wherein said digital image data is composed of grayscale data having plural bit widths.

7. The display control circuit according to claim 1, wherein said digital image data is composed of grayscale data having plural bit widths and polarity data defining the output polarity.

8. The display control circuit according to claim 1, wherein said operational amplifier controlling circuit generates a signal shutting off the constant current source of the Pch side input stage and activating the constant current source of the Nch side input stage in case the analog signal corresponding to said digital image data is higher than an intermediate voltage and wherein said operational amplifier controlling circuit generates a signal activating the constant current source of the Pch side input stage and shutting off the constant current source of the Nch side input stage in case the analog signal corresponding to said digital image data is higher than an intermediate voltage.

9. A display control circuit comprising:

a selector circuit connected to a digital image data signal line to output an analog signal of a magnitude corresponding to input digital image data;

an operational amplifier control circuit being connected to the digital image data signal line and generating and outputting a control signal having a polarity corresponding to the input digital image; and an operational amplifier including:

a first input stage and a second input stage, made up of differential transistor pairs of respective opposite conductivity types; and a first constant current source and a second constant current source supplying respective bias currents to the first input stage and the second input stage; the first constant current source and the second constant current source being controlled to be selectively turned on depending on the polarity of the control signal;

wherein an output of said selector circuit is changed over responsive to a switching signal in respective reverse phases and coupled to said first and second input stages respectively, and an output terminal is changed over responsive to said switching signal in respective reverse phases and coupled to said second and first input stages respectively, so that said first and second input stages are controlled to be interchanged by said switching signal.

10. The display control circuit according to claim 9, wherein said operational amplifier includes a first differential transistor pair and a second differential transistor pair of respective opposite conductivity types, having control electrodes connected to a first input terminal and to a second input terminal, respectively, and having second electrodes connected common;

a first constant current source having one end connected to a second power supply terminal and a second constant current source having one end connected to a first power supply terminal;

a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources, respectively, and having control electrodes supplied with said control signal;

a first current mirror circuit connected across an output end of said first differential transistor pair and an output end of said second differential transistor pair on one hand and said first power supply terminal on the other hand;

a second current mirror circuit connected across the other output end of said first differential transistor pair and the other output end of said second differential transistor pair on one hand and said first power supply terminal on the other hand;

a seventh transistor and an eighth transistor, having one first electrode connected to one output end of said second differential transistor pair and to said first current mirror circuit and having the other first electrode connected to the other output end of said second differential transistor pair and to said second current mirror circuit, said seventh and eighth transistors having respective second electrodes connected to said second power supply terminal, said seventh and eighth transistors having control electrodes connected common;

first and second switches for changing over one output end or the other output end of said second differential transistor pair for operating in reverse phase, responsive to a switching signal, for coupling the output end changed over for operating in reverse phase to control electrodes of said seventh and eighth transistors connected common and third and fourth switches for changing over the other output end or the one output end of said second differential transistor pair for operating in reverse phase, responsive to said switching signal, for coupling the output end changed over for operating in reverse phase to an output.

11. The display control circuit according to claim 9, wherein said operational amplifier includes a first differential transistor pair and a second differential transistor pair of respective opposite conductivity types, having control electrodes connected to a first input terminal and to a second input terminal, respectively, and having second electrodes connected common;

a first constant current source having one end connected to a second power supply terminal and a second constant current source having one end connected to a first power supply terminal;

a first transistor and a second transistor of respective opposite conductivity types, said first transistor having a first electrode connected to the second electrodes, connected common, of said first differential transistor pair, said second transistor having a first electrode connected to the second electrodes, connected common, of said second differential transistor pair, said first and second transistors having second electrodes connected to the other ends of said first and second constant current sources, respectively, and having control electrodes supplied with said control signal;

a first current mirror circuit connected across an output end of said first differential transistor pair and an output end of said second differential transistor pair on one hand and said first power supply terminal on the other hand;

a second current mirror circuit connected across the other output end of said first differential transistor pair and the other output end of said second differential transistor pair on one hand and said first power supply terminal on the other hand;

a third transistor and a fourth transistor of opposite conductivity types, said third transistor being connected across the second electrodes of the first differential transistor pair, connected common, and said second power supply terminal, and said fourth transistor being connected across the second electrodes of the second differential transistor pair, connected common, and said first power supply terminal;

a fifth transistor and a sixth transistor of opposite conductivity types, having first electrodes connected common to an output terminal and having second electrodes connected to said first and second power supply terminals, respectively, said fifth and sixth transistors performing push-pull operations by inputs to respective control terminals;

a seventh transistor and an eighth transistor, having one first electrodes connected to one output end of said second differential transistor pair and to said first current mirror circuit and having the other first electrodes connected to the other output end of said second differential transistor pair and to said second current mirror circuit, said seventh and eighth transistors having respective second electrodes connected to said second power supply terminal, said seventh and eighth transistors having control electrodes connected common;

a driving circuit for level-shifting a signal supplied parallel from said first and second load circuits to supply the level-shifted input signals to the control electrodes of said fifth and sixth transistors first and second switches for changing over one output end or the other output end of said second differential transistor pair for operating in reverse phase, responsive to a switching signal, for coupling the output end changed over for operating in reverse phase to control electrodes of said seventh and eighth transistors connected common; and third and fourth switches for changing over the other output end or the one output end of said second differential transistor pair for operating in reverse phase, responsive to said switching signal, for coupling the output end changed over for operating in reverse phase to an output.

12. The display control circuit according to claim 9, wherein said digital image data is composed of grayscale data having plural bit widths.

13. The display control circuit according to claim 9, wherein said digital image data is composed of grayscale data having plural bit widths and polarity data defining the output polarity.

14. The display control circuit according to claim 9, wherein said operational amplifier controlling circuit generates a signal shutting off the constant current source of the Pch side input stage and activating the constant current source of the Nch side input stage in case the analog signal corresponding to said digital image data is higher than an intermediate voltage and wherein said operational amplifier controlling circuit generates a signal activating the constant current source of the Pch side input stage and shutting off the constant current source of the Nch side input stage in case the analog signal corresponding to said digital image data is higher than an intermediate voltage.

* * * * *